US012805102B2

(12) United States Patent
Cheng et al.

(10) Patent No.: US 12,805,102 B2
(45) Date of Patent: Nov. 17, 2026

(54) TILED DISPLAY DEVICE

(71) Applicant: AUO Corporation, Hsinchu City (TW)

(72) Inventors: Sheng-Yen Cheng, Hsinchu City (TW); Yueh-Hung Chung, Hsinchu City (TW); Ya-Ling Hsu, Hsinchu City (TW)

(73) Assignee: AUO CORPORATION, Hsinchu City (TW)

( * ) Notice: Subject to any disclaimer, the term of this patent is extended or adjusted under 35 U.S.C. 154(b) by 0 days.

(21) Appl. No.: 19/299,472

(22) Filed: Aug. 14, 2025

(65) Prior Publication Data

US 2026/0182131 A1 Jun. 25, 2026

(30) Foreign Application Priority Data

Dec. 24, 2024 (TW) ................................ 113150474

(51) Int. Cl.
*G09G 3/32* (2016.01)
*H10H 29/24* (2025.01)
*H10H 29/85* (2025.01)

(52) U.S. Cl.
CPC ............ *H10H 29/857* (2025.01); *G09G 3/32* (2013.01); *H10H 29/24* (2025.01); *G09G 2300/026* (2013.01); *G09G 2300/0426* (2013.01); *G09G 2300/0439* (2013.01); *G09G 2320/0242* (2013.01)

(58) Field of Classification Search
CPC ......... H10H 29/24; H10H 29/857; G09G 3/32
USPC .......................................................... 345/211
See application file for complete search history.

(56) References Cited

U.S. PATENT DOCUMENTS

| | | | | |
|---|---|---|---|---|
| 2017/0277315 | A1 | 9/2017 | Wu | |
| 2017/0309698 | A1* | 10/2017 | Bower | G06F 3/0412 |
| 2021/0183835 | A1 | 6/2021 | Lin | |
| 2022/0052078 | A1* | 2/2022 | Kim | H10D 86/0212 |
| 2022/0077277 | A1 | 3/2022 | Shin | |
| 2022/0123026 | A1 | 4/2022 | Oh | |

(Continued)

FOREIGN PATENT DOCUMENTS

| | | | |
|---|---|---|---|
| CN | 211742531 | U | 10/2020 |
| CN | 116799026 | A | 9/2023 |
| KR | 20200088954 | A | 7/2020 |

(Continued)

*Primary Examiner* — Calvin C Ma
(74) *Attorney, Agent, or Firm* — McClure, Qualey & Rodack, LLP

(57) ABSTRACT

A tiled display device includes display panels. Each display panel includes pixel units. Each pixel unit includes X pads and Y light emitting elements. X and Y are positive integers, and X/2>Y. Y light emitting elements include a first light emitting element, a second light emitting element and a third light emitting element. The display panels include a first display panel and a second display panel, and a tiling line exists between the first and the second display panels. In each pixel unit of the first display panel, the first light emitting element, the second light emitting element and the third light emitting element are arranged in a first direction. In each pixel unit of the second display panel, the first light emitting element, the second light emitting element and the third light emitting element are arranged in a second direction that is 180 degrees from the first direction.

17 Claims, 10 Drawing Sheets

(56) References Cited

U.S. PATENT DOCUMENTS

| | | | | |
|---|---|---|---|---|
| 2023/0005986 A1* | 1/2023 | Kang | ........................ | G09G 3/32 |
| 2023/0111709 A1* | 4/2023 | Lin | ........................ | H10W 90/00<br>257/89 |

FOREIGN PATENT DOCUMENTS

| | | | |
|---|---|---|---|
| KR | 20220031827 | A | 3/2022 |
| TW | 1759173 | B | 3/2022 |

* cited by examiner

TILED DISPLAY DEVICE

CROSS-REFERENCE TO RELATED APPLICATION

This application claims priority to Taiwan Application Serial Number 113150474, filed Dec. 24, 2024, which is herein incorporated by reference in its entirety.

BACKGROUND

Field of Invention

The present disclosure relates to a tiled display device.

Description of Related Art

With the increasing development of the technology industry, display devices have been widely used in daily life. Tiled display devices formed by tiling display panels including light emitting elements are often used in large-scale display activities. However, the light emitting elements may be bluish or reddish at the pads of different electrical properties, and the display areas of the display panels must be tiled with each other and the peripheral areas of the display panels must be aligned to the outside of the tiled display device. Therefore, the light emitting elements and pads of the display panels on both sides of the tiling line are arranged in opposite directions, resulting in inconsistent positions of bluish and reddish on the display panels on both sides of the tiling line and making the tiled display device have an obvious tiling boundary, which in turn leads to a decrease in display quality.

SUMMARY

At least one embodiment of the present disclosure provides a tiled display device which can avoid obvious tiling boundary and thus improve display quality.

The tiled display device according to at least one embodiment of the present disclosure includes multiple display panels, and each of the display panels includes multiple pixel units arranged in an array. Each of the pixel units includes X pads and Y light emitting elements. X is a positive integer, and the X pads include multiple first pads and multiple second pads. Y is a positive integer, and $$\frac{X}{2} > Y.$$

Each of the Y light emitting elements is electrically connected to one of the first pads and one of the second pads, and the Y light emitting elements include a first light emitting element, a second light emitting element and a third light emitting element. The color light emitted by the first light emitting element, the color light emitted by the second light emitting element and the color light emitted by the third light emitting element are different from each other. The display panels include a first display panel and a second display panel, and a tiling line exists between the first display panel and the second display panel. In each of the pixel units of the first display panel, the first light emitting element, the second light emitting element and the third light emitting element are sequentially arranged in a first direction. In each of the pixel units of the second display panel, the first light emitting element, the second light emitting element and the third light emitting element are sequentially arranged in a second direction, and the second direction is 180 degrees from the first direction.

The tiled display device according to at least another embodiment of the present disclosure includes multiple display panels, and each of the display panels includes multiple pixel units arranged in an array. Each of the pixel units includes X pads and Y light emitting elements. X is a positive integer, and the X pads include multiple first pads and multiple second pads. Y is a positive integer, and $$\frac{X}{2} > Y.$$

Each of the Y light emitting elements is electrically connected to one of the first pads and one of the second pads, and the Y light emitting elements include a first light emitting element, a second light emitting element and a third light emitting element. The color light emitted by the first light emitting element, the color light emitted by the second light emitting element and the color light emitted by the third light emitting element are different from each other. The display panels include a first display panel and a second display panel, and a tiling line exists between the first display panel and the second display panel. In each of the pixel units of the first display panel, the first light emitting element has a first end and a second end in sequence in a first direction. In each of the pixel units of the second display panel, the first light emitting element has a third end and a fourth end in sequence in a second direction that is 180 degrees from the first direction. The first end and the fourth end are electrically connected to one of the first pad and the second pad apiece, and the second end and the third end are electrically connected to the other of the first pad and the second pad apiece.

DETAILED DESCRIPTION

Figure 1:
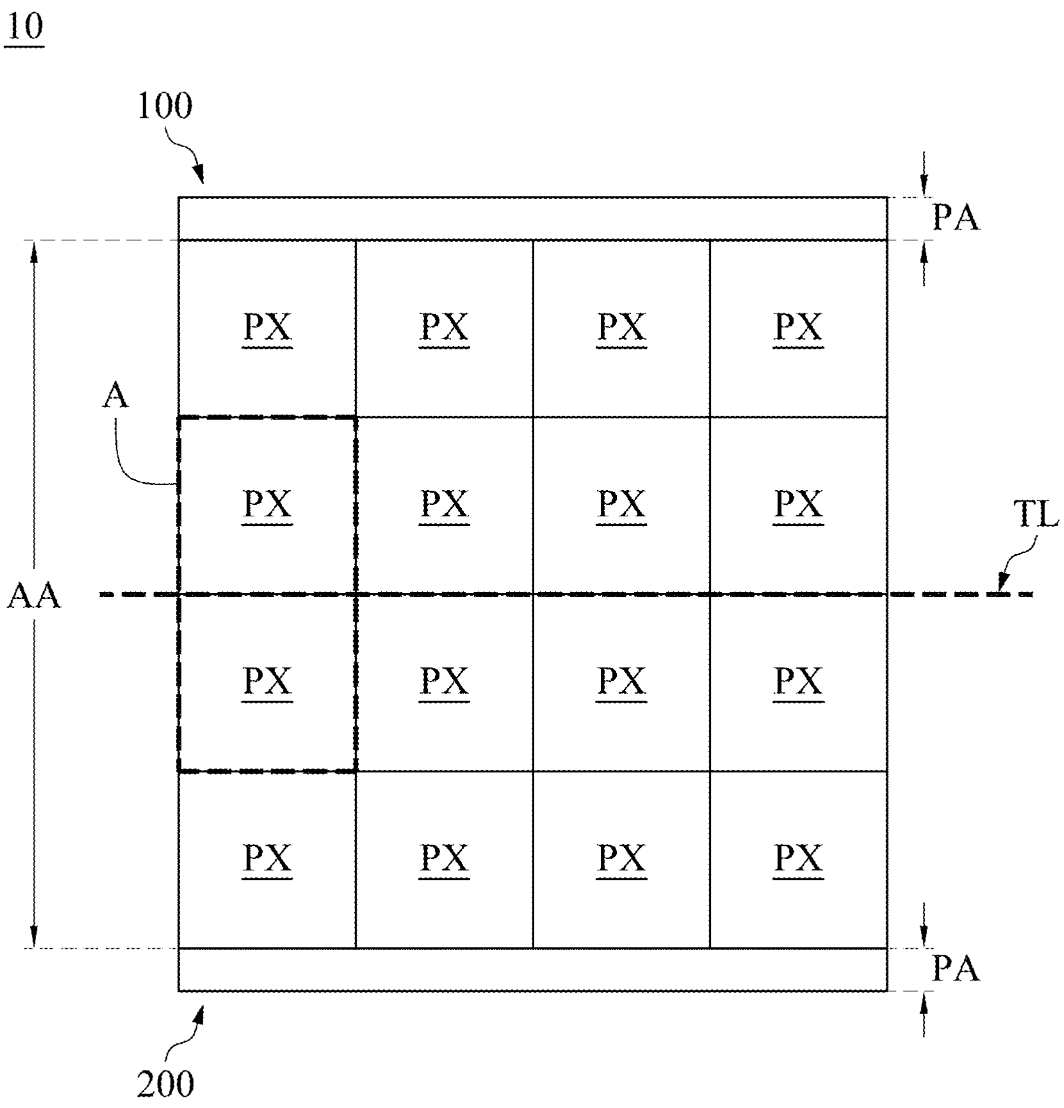
FIG. 1 is a schematic top view of a tiled display device according to at least one embodiment of the present disclosure.

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Furthermore, the words "about", "approximately" or "substantially" used in the present disclosure not only cover the clearly stated numerical values and numerical ranges, but also cover those that can be understood by a person with ordinary knowledge in the technical field to which the present disclosure belongs. The permissible deviation range can be determined by the error generated during measurement, and the error is caused, for example, by limitations of the measurement system or process conditions. For example, two objects (such as the plane or traces of a substrate) are "substantially parallel" or "substantially perpendicular," where "substantially parallel" and "substantially perpendicular," respectively, mean that parallelism and perpendicularity between the two objects can include non-parallelism and non-perpendicularity caused by permissible deviation ranges.

In addition, "about" may mean within one or more standard deviations of the above values, such as within ±30%, ±20%, ±10%, or ±5%. Such words as "about", "approximately", or "substantially" as appearing in the present disclosure may be used to select an acceptable range of deviation or standard deviation according to optical properties, etching properties, mechanical properties, or other properties, rather than applying all of the above optical properties, etching properties, mechanical properties, and other properties with a single standard deviation.

The spatial relative terms used in the present disclosure, such as "below," "under," "above," "on," and the like, are intended to facilitate the recitation of a relative relationship between one element or feature and another as depicted in the drawings. The true meaning of these spatial relative terms includes other orientations. For example, the relationship between one element and another may change from "below" and "under" to "above" and "on" when the drawing is turned 180 degrees up or down. In addition, spatially relative descriptions used in the present disclosure should be interpreted in the same manner.

It should be understood that while the present disclosure may use terms such as "first", "second", "third" to describe various elements or features, these elements or features should not be limited by these terms. These terms are primarily used to distinguish one element from another, or one feature from another. In addition, the term "or" as used in the present disclosure may include, as appropriate, any one or a combination of the listed items in association.

Moreover, the present disclosure may be implemented or applied in various other specific embodiments, and the details of the present disclosure may be combined, modified, and altered in various embodiments based on different viewpoints and applications, without departing from the idea of the present disclosure.

Figure 2A:
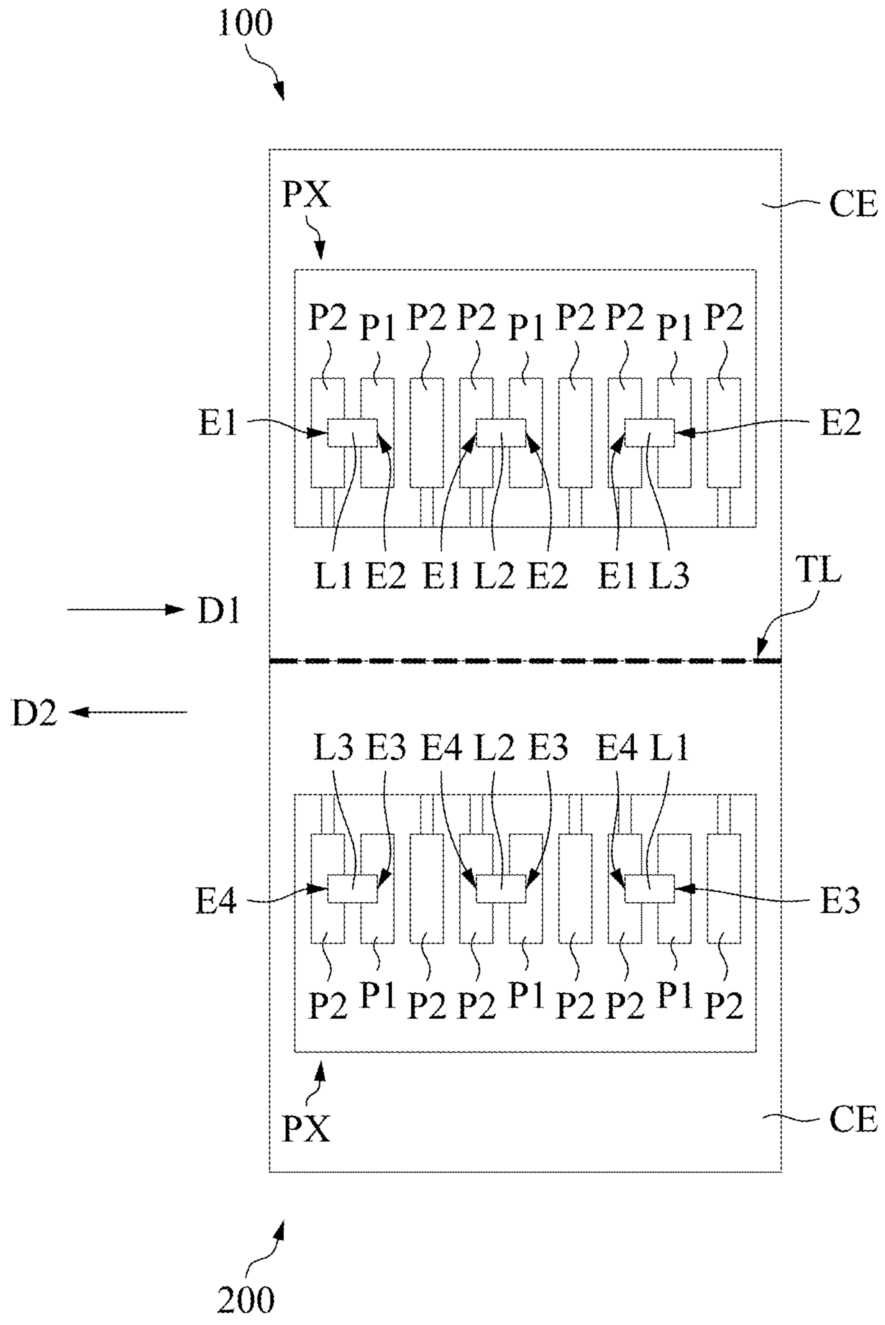
FIG. 2A is an enlarged diagram of region A in FIG. 1.

FIG. 1 is a schematic top view of a tiled display device 10 according to at least one embodiment of the present disclosure. FIG. 2A is an enlarged diagram of region A in FIG. 1. Referring to FIG. 1 and FIG. 2A, the tiled display device 10 includes multiple display panels 100, 200, and each of the display panels 100, 200 includes multiple pixel units PX arranged in an array. It is worth noting that in order to simplify the expression of the figure, FIG. 1 merely depicts that the display panels 100, 200 each include eight pixel units PX as a representative representation. However, it can be understood that other pixel units PX may also be included where not shown on the page of the figure.

Each pixel unit PX includes X pads P1, P2 and Y light emitting elements L1, L2, L3. X is a positive integer, and the X pads include multiple first pads P1 and multiple second pads P2. Y is a positive integer, and $$\frac{X}{2} > Y.$$

Each of the light emitting elements L1, L2, L3 is electrically connected to one of the first pads P1 and one of the second pads P2, and the Y light emitting elements L1, L2, L3 include a first light emitting element L1, a second light emitting element L2 and a third light emitting element L3. The color light emitted by the first light emitting element L1, the color light emitted by the second light emitting element L2 and the color light emitted by the third light emitting element L3 are different from each other.

The display panels 100, 200 include a first display panel 100 and a second display panel 200, and a tiling line TL exists between the first display panel 100 and the second display panel 200. In each of the pixel units PX of the first display panel 100, the first light emitting element L1, the second light emitting element L2 and the third light emitting element L3 are sequentially arranged in a first direction D1. In each of the pixel units PX of the second display panel 200, the first light emitting element L1, the second light emitting element L2 and the third light emitting element L3 are sequentially arranged in a second direction D2, and the second direction D2 is substantially 180 degrees from the first direction D1.

By the design of the number and the arrangement of pads P1, P2 and light emitting elements L1, L2, L3, the display panels 100, 200 located on both sides of the tiling line TL can have the consistent positions of bluish and reddish, e.g., the positions of bluish in the display panels 100, 200 are located on the right side of the tiled display device 10 and the positions of reddish in the display panels 100, 200 are located on the left side of the tiled display device 10, thus avoiding the obvious tiling boundary and further improving the display quality.

As shown in FIG. 1, the tiled display device 10 has a display area AA and a peripheral area PA adjacent to the display area AA. In detail, the display area AA of the tiled display device 10 includes a display area (not labeled) of the first display panel 100 and a display area (not labeled) of the second display panel 200 tiled with the display area of the first display panel 100, and the tiling line TL is located between the display area of the first display panel 100 and the display area of the second display panel 200, and the peripheral area PA of the tiled display device 10 includes a peripheral area (not labeled) of the first display panel 100 and a peripheral area (not labeled) of the second display panel 200 located the outside the tiled display device 10.

As shown in FIG. 2A, in each of the pixel units PX of the first display panel 100, the first pads P1 and the second pads P2 have a first arrangement order in the first direction D1. In each of the pixel units PX of the second display panel 200, the first pads P1 and the second pads P2 have a second arrangement order in the second direction D2. The first direction D1 and the second direction D2 are substantially parallel to the tiling line TL, and the first arrangement order is the same as the second arrangement order.

With the above-mentioned design of the first arrangement order being the same as the second arrangement order, the display panels 100, 200 located on both sides of the tiling line TL can have the consistent positions of bluish and reddish, so that the obvious tiling boundary can be avoided, thereby improving the display quality. In addition, the same photomask can be used to produce the array substrates of the display panels 100, 200, thus avoiding increasing the cost of producing additional photomasks.

In each of the pixel units PX of the first display panel 100, the first light emitting element L1 has a first end E1 and a second end E2 in sequence in the first direction D1. In each of the pixel units PX of the second display panel 200, the first light emitting element L1 has a third end E3 and a fourth end E4 in sequence in the second direction D2.

In some embodiments, as shown in FIG. 2A, the first end E1 and the fourth end E4 are electrically connected to the second pads P2 respectively, and the second end E2 and the third end E3 are electrically connected to the first pads P1 respectively. In other embodiments, the first end E1 and the fourth end E4 are electrically connected to the first pads P1 respectively, and the second end E2 and the third end E3 are electrically connected to the second pads P2 respectively.

Since the first end E1 located at on the left side of the first light emitting element L1 of each of the pixel units PX of the first display panel 100 and the fourth end E4 located at on the left side of the first light emitting element L1 of each of the pixel units PX of the second display panel 200 are electrically connected to one of the first pad P1 and the second pad P2 apiece, and the second end E2 located at on the right side of the first light emitting element L1 of each of the pixel units PX of the first display panel 100 and the third end E3 located at on the right side of the first light emitting element L1 of each of the pixel units PX of the second display panel 200 are electrically connected to the other of the first pad P1 and the second pad P2 apiece, the display panels 100, 200 located on both sides of the tiling line TL can have the consistent positions of bluish and reddish, so that the obvious tiling boundary can be avoided, thereby improving the display quality.

Similarly, in each of the pixel units PX of the first display panel 100, the second light emitting element L2 has a first end E1 and a second end E2 in sequence in the first direction D1, and the third light emitting element L3 has a first end E1 and a second end E2 in sequence in the first direction D1. In each of the pixel units PX of the second display panel 200, the second light emitting element L2 has a third end E3 and a fourth end E4 in sequence in the second direction D2, and the third light emitting element L3 has a third end E3 and a fourth end E4 in sequence in the second direction D2. The first ends E1 and the fourth ends E4 are electrically connected to one of the first pad P1 and the second pad P2 apiece, and the second ends E2 and the third ends E3 are electrically connected to the other of the first pad P1 and the second pad P2 apiece.

In detail, as shown in FIG. 2A, the number X of the pads P1 and P2 is equal to 9, the number Y of the light emitting elements L1, L2, L3 is equal to 3, the number of the first pads P1 is 3, and the number of the second pads P2 is 6. In each of the pixel units PX of the first display panel 100 and in each of the pixel units PX of the second display panel 200, an arrangement order of the first pads P1 and the second pads P2 in the first direction D1 is the second pad P2, the first pad P1, the second pad P2, the second pad P2, the first pad P1, the second pad P2, the second pad P2, the first pad P1, and the second pad P2. Each of the first pads P1 receives an operating voltage (Vdd), and each of the second pads P2 receives a reference voltage (Vss).

In some embodiments, the reference voltage may be, for example, a ground voltage or a common voltage. As shown in FIG. 2A, the first display panel 100 and the second display panel 200 further include a common electrode CE, and the second pads P2 are electrically connected to the common electrode CE, and the operating voltage may be, for example, a signal voltage obtained by electrically connecting to a signal line (not shown).

The first light emitting element L1, the second light emitting element L2 and the third light emitting element L3 may be light emitting diodes (LEDs) including an n-type electrode and a p-type electrode, and the first pad P1 and the second pad P2 are electrically connected to the n-type electrode and the p-type electrode respectively, and the n-type electrode and the p-type electrode are respectively disposed at two ends of each of the first light emitting element L1, the second light emitting element L2 and the third light emitting element L3. The light emitting diode is, for example, a sub-millimeter light emitting diode (mini LED) or a micro light emitting diode (micro LED, μLED). The thickness of the micro light emitting diode is less than 10 micrometers, for example, 6 micrometers. Sub-millimeter light emitting diodes can be divided into two types: one with encapsulation glue and the other without encapsulation glue. The thickness of the sub-millimeter light emitting diode with encapsulation glue can be less than 800 micrometers, and the thickness of the sub-millimeter light emitting diode without encapsulation glue can be less than 100 micrometers. In addition, the first light emitting element L1, the second light emitting element L2 and the third light emitting element L3 can also be large-sized regular LEDs other than sub-millimeter LEDs and micro LEDs, so the first light emitting element L1, the second light emitting element L2 and the third light emitting element L3 are not limited to sub-millimeter LEDs or micro LEDs.

In some embodiments, the first light emitting element L1, the second light emitting element L2, and the third light emitting element L3 may emit red light, green light, and blue light respectively, but the present disclosure is not limited thereto. In addition, in this embodiment, the number Y of the light emitting elements L1, L2, and L3 is equal to 3, but the present disclosure is not limited thereto. In other embodiments, the number of light emitting elements may be greater than or less than 3.

Referring to FIG. 2A, in each of the pixel units PX of the first display panel 100 and in each of the pixel units PX of the second display panel 200, the first ends E1 and the fourth ends E4 of the first light emitting element L1, the second light emitting element L2 and the third light emitting element L3 are all electrically connected to the second pads P2, and the second ends E2 and the third ends E3 of the first light emitting element L1, the second light emitting element L2 and the third light emitting element L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

Figure 2B:
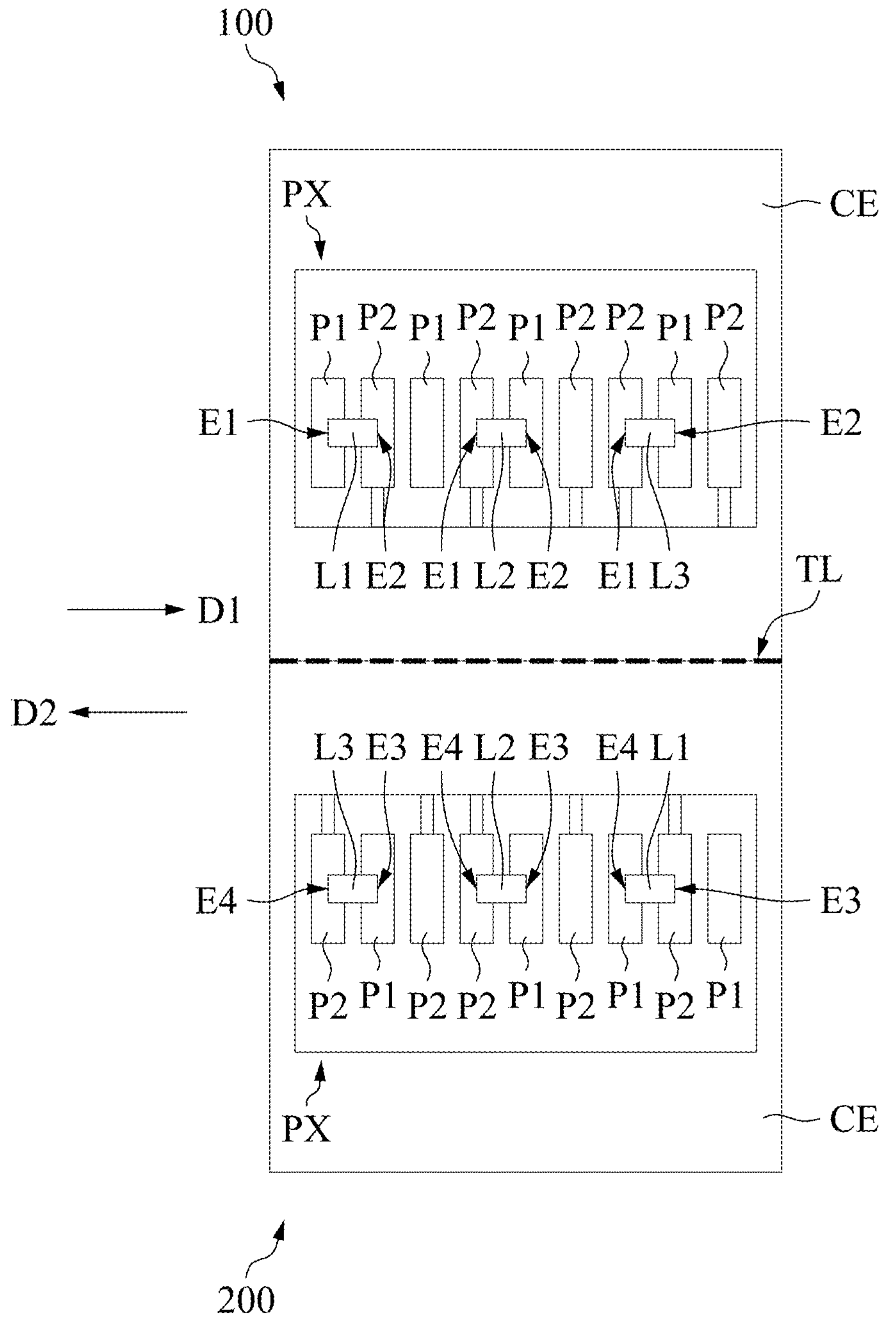
FIG. 2B and FIG. 2C are enlarged diagrams of tiled display devices according to at least another embodiment of the present disclosure.

FIG. 2B is an enlarged diagram of a tiled display device according to at least another embodiment of the present disclosure. Referring to FIG. 2B, the structures and the relative positions of most elements in the embodiment of FIG. 2B and the embodiment of FIG. 2A are the same, and the schematic top view of the tiled display device of FIG. 2B is substantially the same as the schematic top view of the tiled display device 10 of FIG. 2A, so the same features are not repeated here. The main difference between the two embodiments is that the number and the arrangement order of the first pads P1 and the second pads P2 in the embodiment of FIG. 2B are different from those in the embodiment of FIG. 2A.

In detail, as shown in FIG. 2B, the number X of the pads P1 and P2 is equal to 9, the number Y of the light emitting elements L1, L2, L3 is equal to 3, the number of the first pads P1 is 4, and the number of the second pads P2 is 5. In each of the pixel units PX of the first display panel 100, an arrangement order of the first pads P1 and the second pads P2 in the first direction D1 is the first pad P1, the second pad P2, the first pad P1, the second pad P2, the first pad P1, the second pad P2, the second pad P2, the first pad P1, and the second pad P2. In each of the pixel units PX of the second display panel 200, an arrangement order of the first pads P1 and the second pads P2 in the first direction D1 is the second pad P2, the first pad P1, the second pad P2, the second pad P2, the first pad P1, the second pad P2, the first pad P1, the second pad P2, and the first pad P1. Each of the first pads P1 receives an operating voltage, and each of the second pads P2 receives a reference voltage.

In each of the pixel units PX of the first display panel 100 and in each of the pixel units PX of the second display panel 200, the first end E1 and the fourth end E4 of the first light emitting elements L1 are both electrically connected to the first pads P1, the second end E2 and the third end E3 of the first light emitting elements L1 are both electrically connected to the second pads P2, the first ends E1 and the fourth ends E4 of the second light emitting elements L2 and the third light emitting elements L3 are all electrically connected to the second pads P2, and the second ends E2 and the third ends E3 of the second light emitting elements L2 and the third light emitting elements L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

Figure 2C:
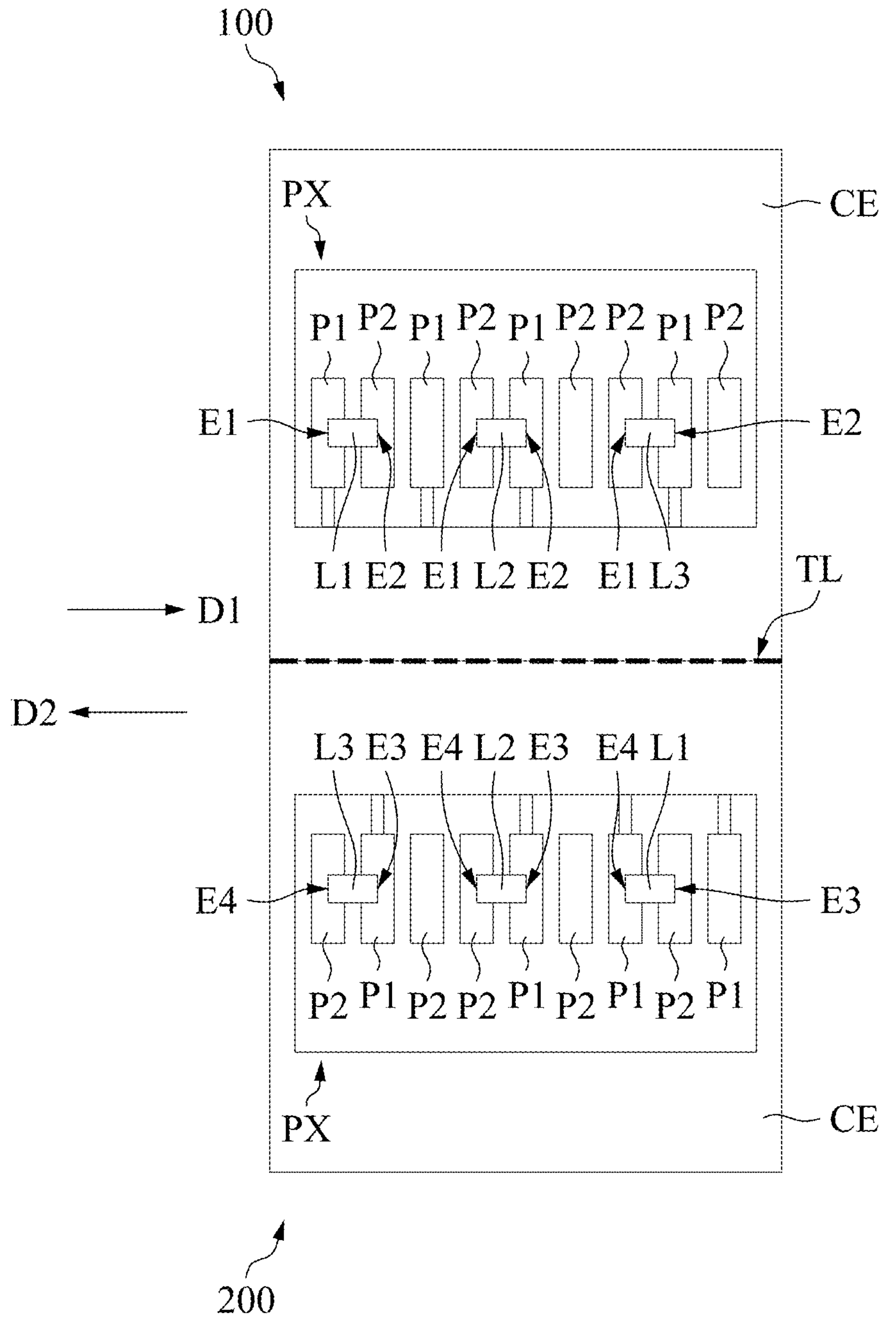

FIG. 2C is an enlarged diagram of a tiled display device according to at least another embodiment of the present disclosure. Referring to FIG. 2C, the structures and the relative positions of most elements in the embodiment of FIG. 2C and the embodiment of FIG. 2B are the same, and the schematic top view of the tiled display device of FIG. 2C is substantially the same as the schematic top view of the tiled display device 10 of FIG. 2A, so the same features are not repeated here. The difference between the embodiment of FIG. 2C and the embodiment of FIG. 2B is that each of the first pads P1 receives a reference voltage and each of the second pads P2 receive an operating voltage in the embodiment of FIG. 2C.

Figure 3A:
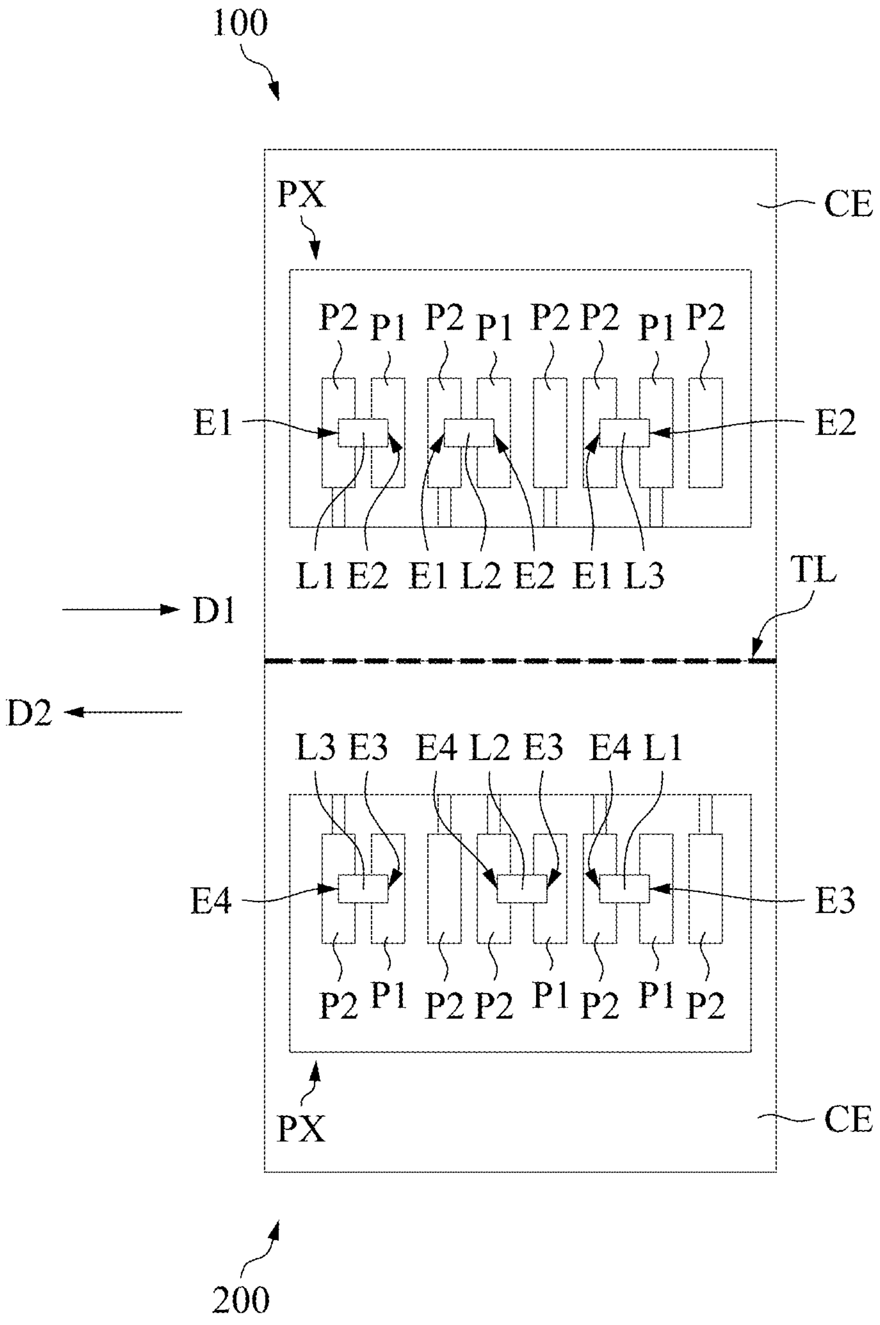
FIG. 3A to FIG. 3C are enlarged diagrams of tiled display devices according to at least another embodiment of the present disclosure.
Figure 3B:
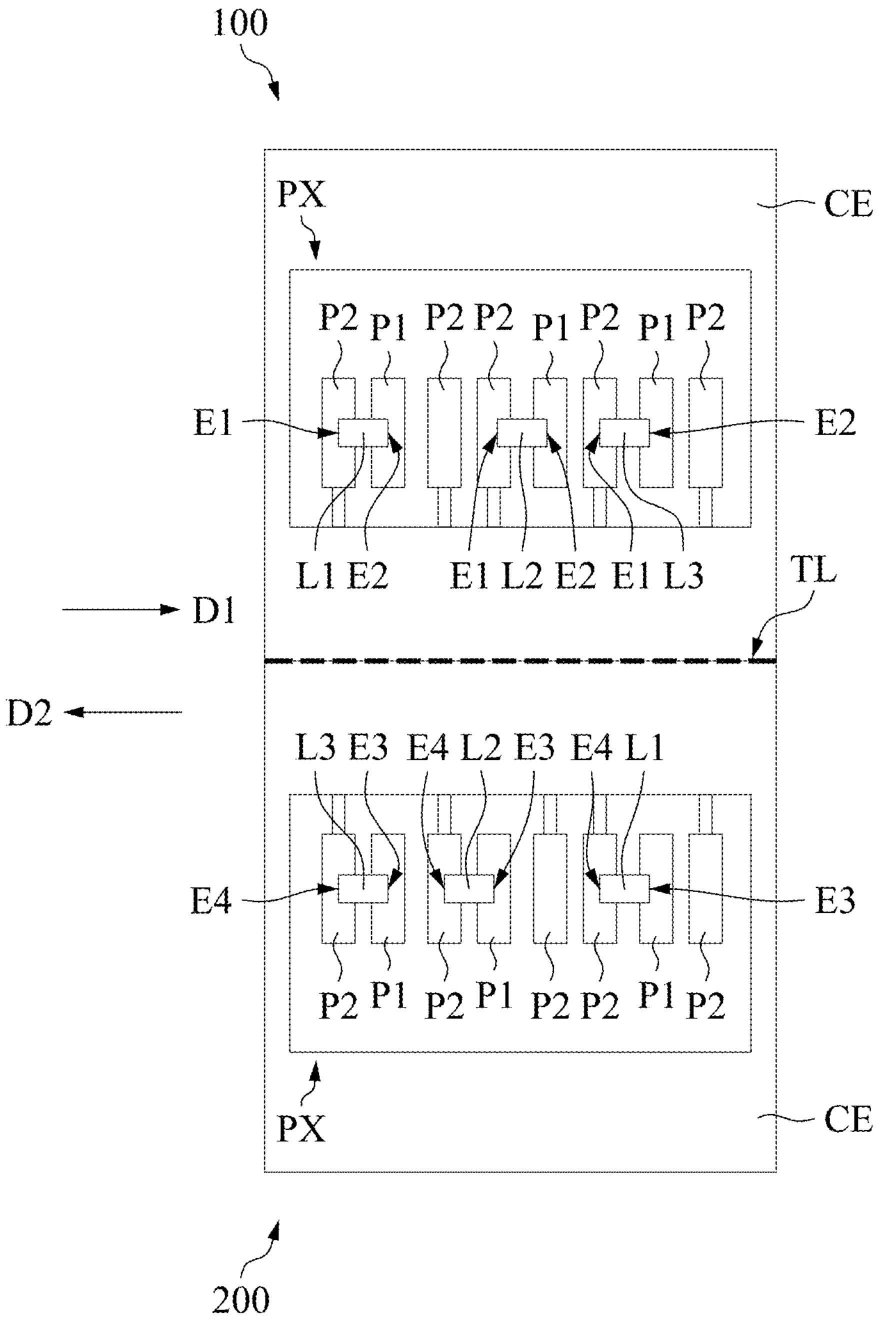
Figure 3C:
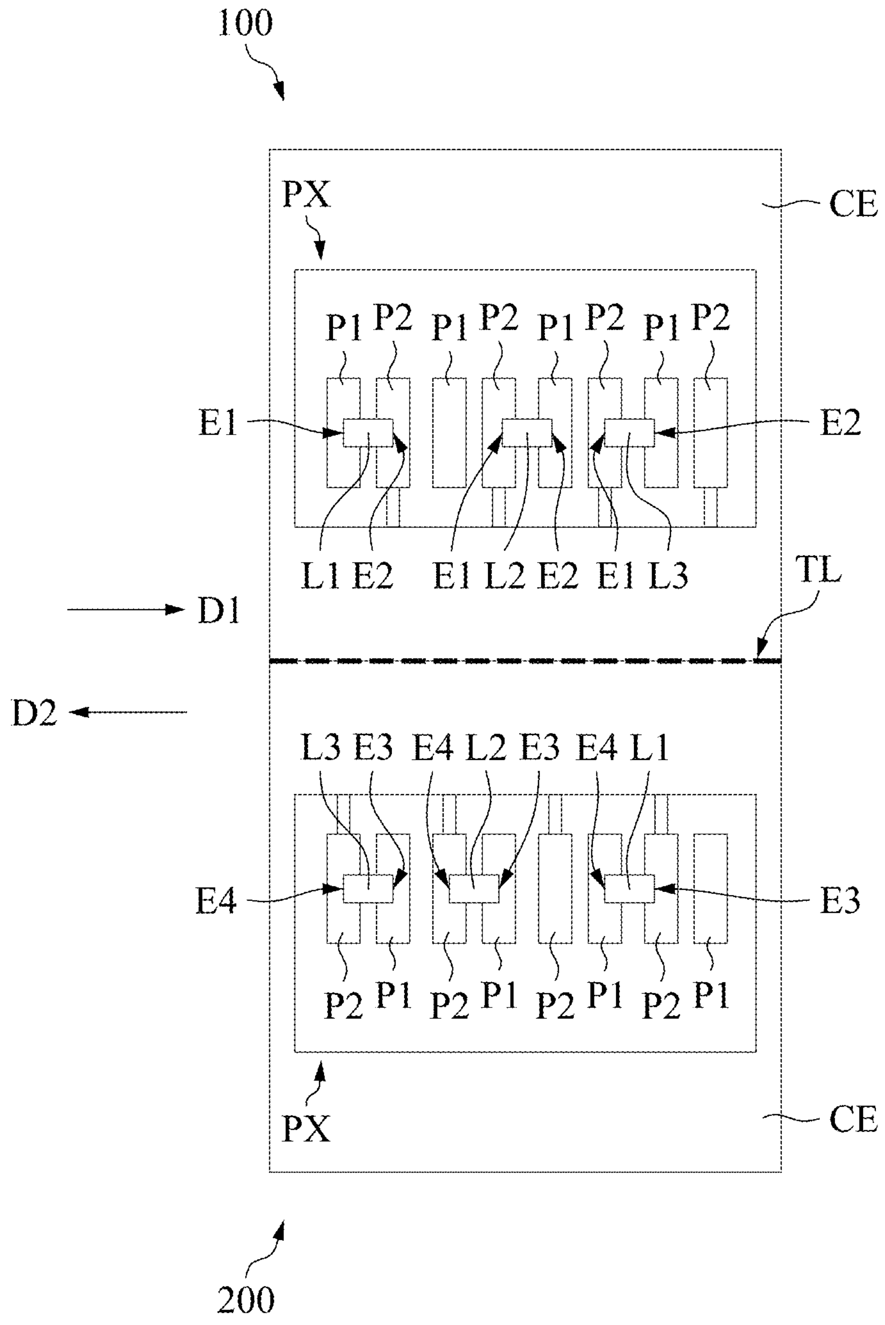

FIG. 3A to FIG. 3C are enlarged diagrams of tiled display devices according to at least another embodiment of the present disclosure. Referring to FIG. 3A to FIG. 3C, the structures and the relative positions of most elements in the embodiments of FIG. 3A to FIG. 3C and the embodiment of FIG. 2A are the same, and the schematic top views of the tiled display devices of FIG. 3A to FIG. 3C are substantially the same as the schematic top view of the tiled display device 10 of FIG. 2A, so the same features are not repeated here. The main difference between the embodiments of FIG. 3A to FIG. 3C and the embodiment of FIG. 2A is that the number X and the arrangement order of the pads P1 and P2 in the embodiments of FIG. 3A to FIG. 3C are different from those in the embodiment of FIG. 2A.

As shown in FIG. 3A, the number X of the pads P1 and P2 is equal to 8, the number Y of the light emitting elements L1, L2, L3 is equal to 3, the number of the first pads P1 is 3, and the number of the second pads P2 is 5. In each of the pixel units PX of the first display panel 100, an arrangement order of the first pads P1 and the second pads P2 in the first direction D1 is the second pad P2, the first pad P1, the second pad P2, the first pad P1, the second pad P2, the second pad P2, the first pad P1, and the second pad P2. In each of the pixel units PX of the second display panel 200, an arrangement order of the first pads P1 and the second pads P2 in the first direction D1 is the second pad P2, the first pad P1, the second pad P2, the second pad P2, the first pad P1, the second pad P2, the first pad P1, and the second pad P2. Each of the first pads P1 receives an operating voltage, and each of the second pads P2 receives a reference voltage.

In each of the pixel units PX of the first display panel 100 and in each of the pixel units PX of the second display panel 200, the first ends E1 and the fourth ends E4 of the first light emitting elements L1, the second light emitting elements L2 and the third light emitting elements L3 are all electrically connected to the second pads P2, and the second ends E2 and the third ends E3 of the first light emitting elements L1, the second light emitting elements L2 and the third light emitting elements L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

As shown in FIG. 3B, the number X of the pads P1 and P2 is equal to 8, the number Y of the light emitting elements L1, L2, L3 is equal to 3, the number of the first pads P1 is 3, and the number of the second pads P2 is 5. In each of the pixel units PX of the first display panel 100, an arrangement order of the first pads P1 and the second pads P2 in the first direction D1 is the second pad P2, the first pad P1, the second pad P2, the second pad P2, the first pad P1, the second pad P2, the first pad P1, and the second pad P2. In each of the pixel units PX of the second display panel 200, an arrangement order of the first pads P1 and the second pads P2 in the first direction D1 is the second pad P2, the first pad P1, the second pad P2, the first pad P1, the second pad P2, the second pad P2, the first pad P1, and the second pad P2. Each of the first pads P1 receives an operating voltage, and each of the second pads P2 receives a reference voltage.

In each of the pixel units PX of the first display panel 100 and in each of the pixel units PX of the second display panel 200, the first ends E1 and the fourth ends E4 of the first light emitting elements L1, the second light emitting elements L2 and the third light emitting elements L3 are all electrically connected to the second pads P2, and the second ends E2 and the third ends E3 of the first light emitting elements L1, the second light emitting elements L2 and the third light emitting elements L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

As shown in FIG. 3C, the number X of the pads P1 and P2 is equal to 8, the number Y of the light emitting elements L1, L2, L3 is equal to 3, the number of the first pads P1 is 4, and the number of the second pads P2 is 4. In each of the pixel units PX of the first display panel 100, an arrangement order of the first pads P1 and the second pads P2 in the first direction D1 is the first pad P1, the second pad P2, the first pad P1, the second pad P2, the first pad P1, the second pad P2, the first pad P1, and the second pad P2. In each of the pixel units PX of the second display panel 200, an arrangement order of the first pads P1 and the second pads P2 in the first direction D1 is the second pad P2, the first pad P1, the second pad P2, the first pad P1, the second pad P2, the first pad P1, the second pad P2, and the first pad P1. Each of the first pads P1 receives an operating voltage, and each of the second pads P2 receives a reference voltage.

In each of the pixel units PX of the first display panel 100 and in each of the pixel units PX of the second display panel 200, the first end E1 and the fourth end E4 of the first light emitting elements L1 are both electrically connected to the first pads P1, the second end E2 and the third end E3 of the first light emitting elements L1 are both electrically connected to the second pads P2, the first ends E1 and the fourth ends E4 of the second light emitting elements L2 and the third light emitting elements L3 are all electrically connected to the second pads P2, and the second ends E2 and the third ends E3 of the second light emitting elements L2 and the third light emitting elements L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

Figure 4A:
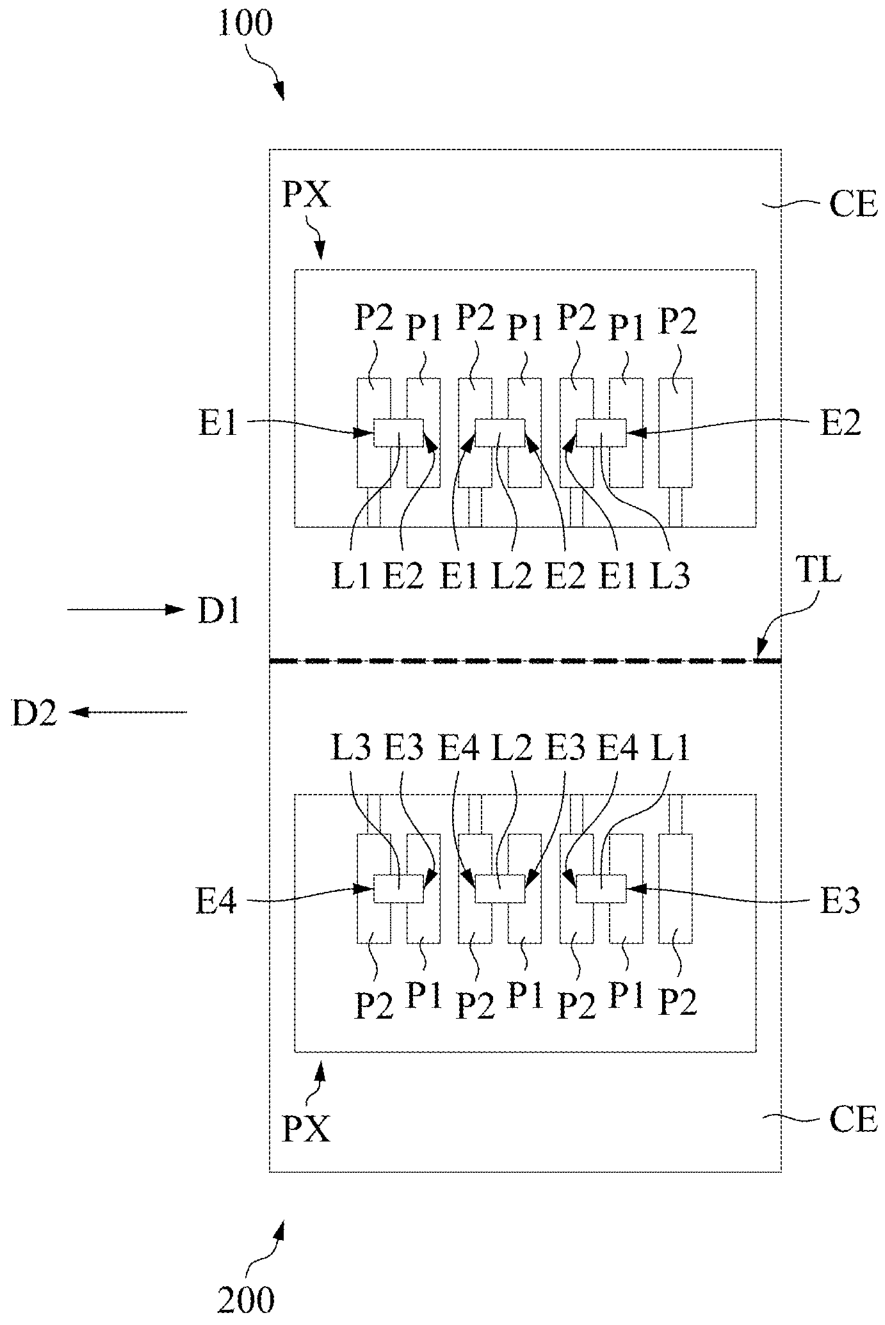
FIG. 4A to FIG. 4C are enlarged diagrams of tiled display devices according to at least another embodiment of the present disclosure.
Figure 4B:
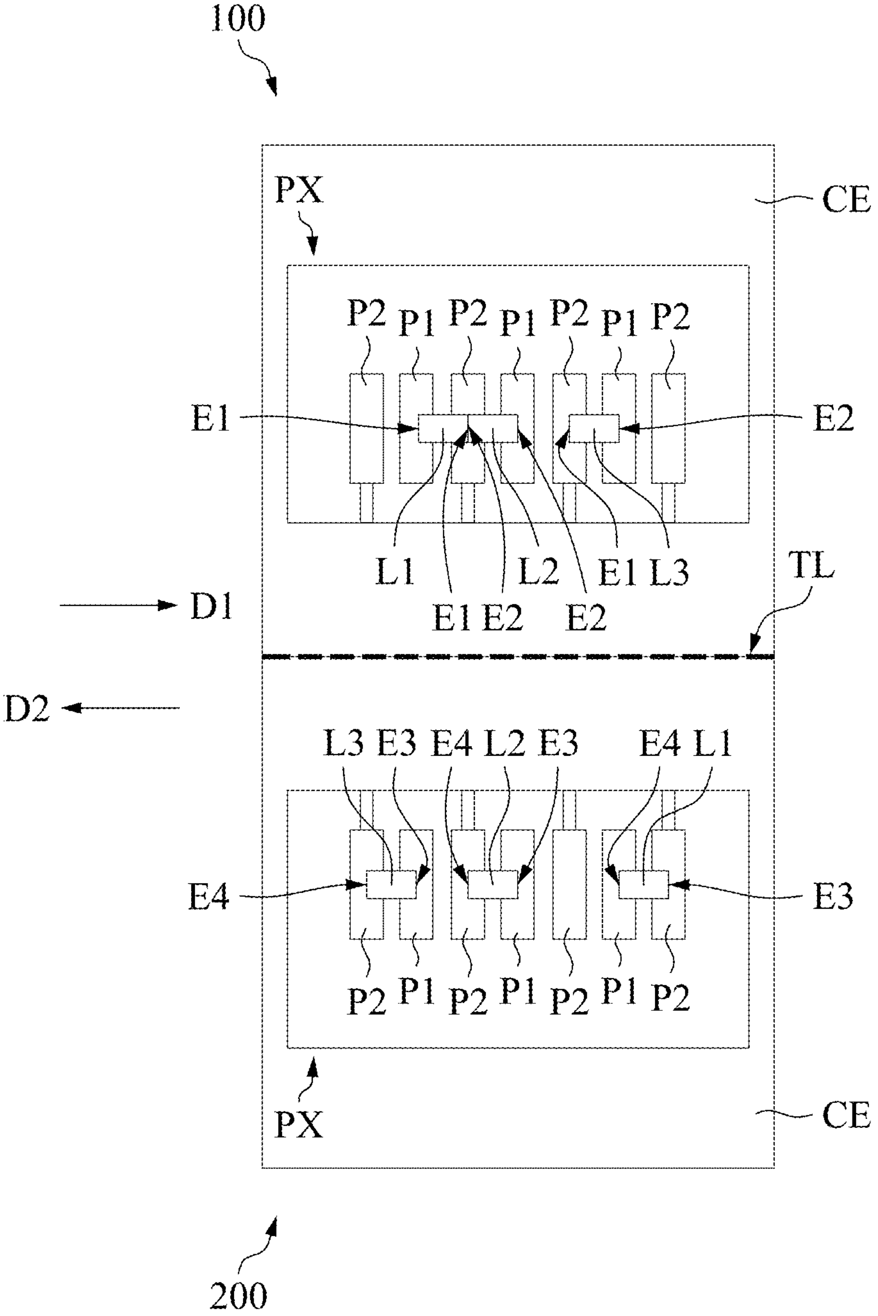
Figure 4C:
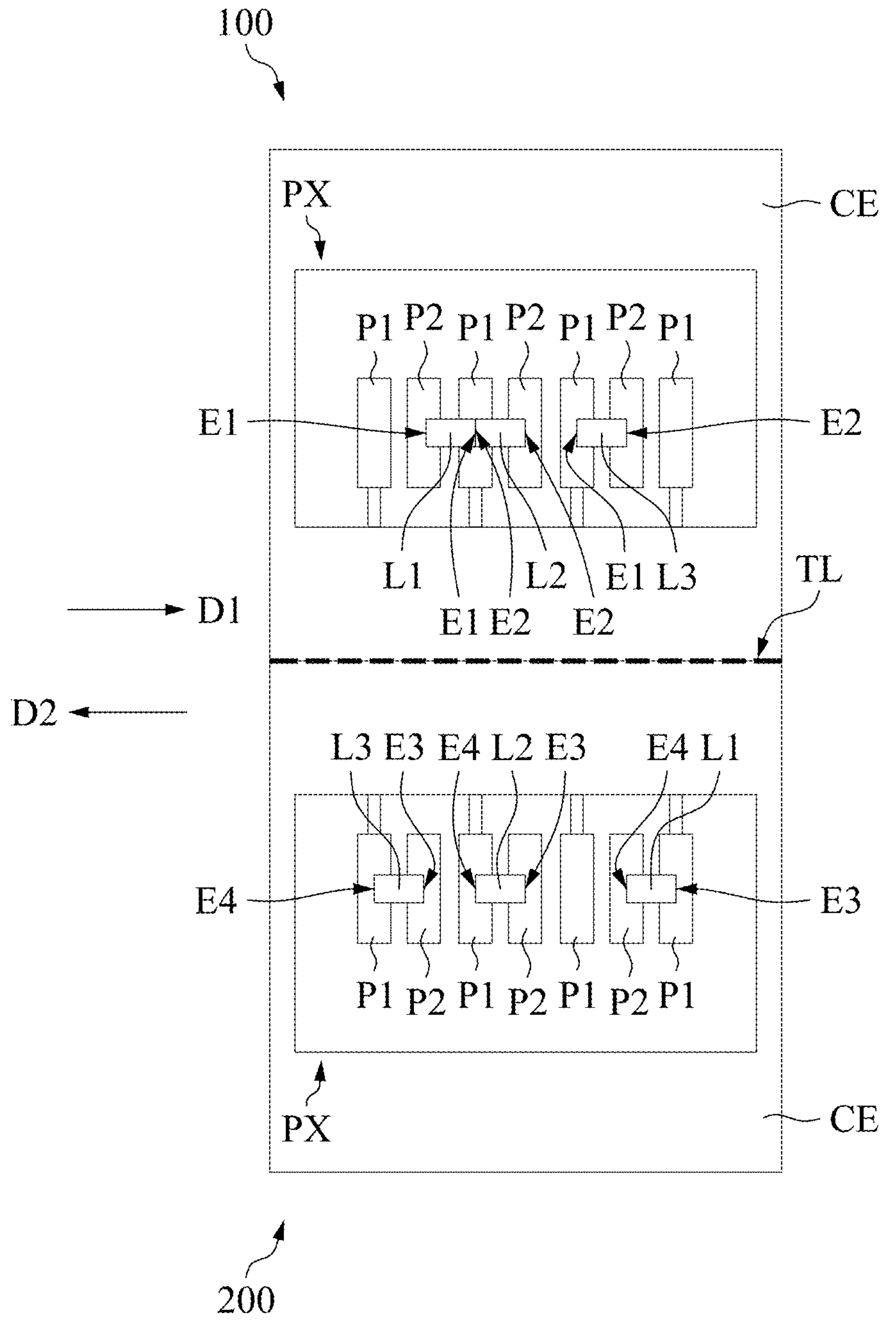

FIG. 4A to FIG. 4C are enlarged diagrams of tiled display devices according to at least another embodiment of the present disclosure. Referring to FIG. 4A to FIG. 4C, the structures and the relative positions of most elements in the embodiments of FIG. 4A to FIG. 4C and the embodiment of FIG. 2A are the same, and the schematic top views of the tiled display devices of FIG. 4A to FIG. 4C are substantially the same as the schematic top view of the tiled display device 10 of FIG. 2A, so the same features are not repeated here. The main difference between the embodiments of FIG. 4A to FIG. 4C and the embodiment of FIG. 2A is that the number X and the arrangement order of the pads P1, P2 in the embodiments of FIG. 4A to FIG. 4C are different from those in the embodiment of FIG. 2A.

As shown in FIG. 4A, the number X of the pads P1 and P2 is equal to 7, the number Y of the light emitting elements L1, L2, L3 is equal to 3, the number of the first pads P1 is 3, and the number of the second pads P2 is 4. In each of the pixel units PX of the first display panel 100 and in each of the pixel units PX of the second display panel 200, an arrangement order of the first pads P1 and the second pads P2 in the first direction D1 is the second pad P2, the first pad P1, the second pad P2, the first pad P1, the second pad P2, the first pad P1, and the second pad P2. Each of the first pads P1 receives an operating voltage, and each of the second pads P2 receives a reference voltage. That is, the pads with an odd number arranged in the first direction D1 receive the reference voltages respectively, and the pads with an even number arranged in the first direction D1 receive the operating voltages.

In each of the pixel units PX of the first display panel 100 and in each of the pixel units PX of the second display panel 200, the first ends E1 and the fourth ends E4 of the first light emitting elements L1, the second light emitting elements L2 and the third light emitting elements L3 are all electrically connected to the second pads P2, and the second ends E2 and the third ends E3 of the first light emitting elements L1, the second light emitting elements L2 and the third light emitting elements L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

As shown in FIG. 4B, the number X of the pads P1 and P2 is equal to 7, the number Y of the light emitting elements L1, L2, L3 is equal to 3, the number of the first pads P1 is 3, and the number of the second pads P2 is 4. In each of the pixel units PX of the first display panel 100 and in each of the pixel units PX of the second display panel 200, an arrangement order of the first pads P1 and the second pads P2 in the first direction D1 is the second pad P2, the first pad P1, the second pad P2, the first pad P1, the second pad P2, the first pad P1, and the second pad P2. Each of the first pads P1 receives an operating voltage, and each of the second pads P2 receives a reference voltage. That is, the pads with an odd number arranged in the first direction D1 receive the reference voltages respectively, and the pads with an even number arranged in the first direction D1 receive the operating voltages. In addition, in each of the pixel units PX of the first display panel 100, the first light emitting element L1 and the second light emitting element L2 are electrically connected to the same one of the second pads P2.

In each of the pixel units PX of the first display panel 100 and in each of the pixel units PX of the second display panel 200, the first end E1 and the fourth end E4 of the first light emitting elements L1 are both electrically connected to the first pads P1, the second end E2 and the third end E3 of the first light emitting elements L1 are both electrically connected to the second pads P2, the first ends E1 and the fourth ends E4 of the second light emitting elements L2 and the third light emitting elements L3 are all electrically connected to the second pads P2, and the second ends E2 and the third ends E3 of the second light emitting elements L2 and the third light emitting elements L3 are all electrically connected to the first pads P1. Therefore, the display panels 100, 200 located on both sides of the tiling line TL can have the consistent positions of bluish and reddish, so that the obvious tiling boundary can be avoided, thereby improving the display quality.

As shown in FIG. 4C, the number X of the pads P1 and P2 is equal to 7, the number Y of the light emitting elements L1, L2, L3 is equal to 3, the number of the first pads P1 is 4, and the number of the second pads P2 is 3. In each of the pixel units PX of the first display panel 100 and in each of the pixel units PX of the second display panel 200, an arrangement order of the first pads P1 and the second pads P2 in the first direction D1 is the first pad P1, the second pad P2, the first pad P1, the second pad P2, the first pad P1, the second pad P2, and the first pad P1. Each of the first pads P1 receives a reference voltage, and each of the second pads P2 receives an operating voltage. That is, the pads with an odd number arranged in the first direction D1 receive the reference voltages respectively, and the pads with an even number arranged in the first direction D1 receive the operating voltages. In addition, in each of the pixel units PX of the first display panel 100, the first light emitting element L1 and the second light emitting element L2 are electrically connected to the same one of the first pads P1.

In each of the pixel units PX of the first display panel 100 and in each of the pixel units PX of the second display panel 200, the first end E1 and the fourth end E4 of the first light emitting elements L1 are both electrically connected to the second pads P2, the second end E2 and the third end E3 of the first light emitting elements L1 are both electrically connected to the first pads P1, the first ends E1 and the fourth ends E4 of the second light emitting elements L2 and the third light emitting elements L3 are all electrically connected to the first pads P1, and the second ends E2 and the third ends E3 of the second light emitting elements L2 and the third light emitting elements L3 are all electrically connected to the second pads P2. Therefore, the display panels 100, 200 located on both sides of the tiling line TL can have the consistent positions of bluish and reddish, so that the obvious tiling boundary can be avoided, thereby improving the display quality.

In summary, in at least one embodiment of the tiled display device of the present disclosure, by the design of the number and the arrangement of pads and light emitting elements, the display panels located on both sides of the tiling line can have the consistent positions of bluish and reddish, thus avoiding the obvious tiling boundary and further improving the display quality.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A tiled display device, comprising:

a plurality of display panels, wherein each of the display panels comprises:

a plurality of pixel units, arranged in an array, wherein each of the pixel units comprises:

X pads, wherein X is a positive integer, and the X pads comprise a plurality of first pads and a plurality of second pads; and Y light emitting elements, wherein Y is a positive integer, and $$\frac{X}{2} > Y,$$

wherein each of the Y light emitting elements is electrically connected to one of the first pads and one of the second pads, and the Y light emitting elements comprise a first light emitting element, a second light emitting element and a third light emitting element, wherein a color light emitted by the first light emitting element, a color light emitted by the second light emitting element and a color light emitted by the third light emitting element are different from each other, wherein the display panels comprise a first display panel and a second display panel, and a tiling line exists between the first display panel and the second display panel, wherein in each of the pixel units of the first display panel, the first light emitting element, the second light emitting element and the third light emitting element are sequentially arranged in a first direction, wherein in each of the pixel units of the second display panel, the first light emitting element, the second light emitting element and the third light emitting element are sequentially arranged in a second direction, and the second direction is 180 degrees from the first direction.

2. The tiled display device of claim 1, wherein in each of the pixel units of the first display panel, the first pads and the second pads have a first arrangement order in the first direction, wherein in each of the pixel units of the second display panel, the first pads and the second pads have a second arrangement order in the second direction, wherein the first direction and the second direction are parallel to the tiling line, and the first arrangement order is the same as the second arrangement order.

3. The tiled display device of claim 1, wherein in each of the pixel units of the first display panel, the first light emitting element has a first end and a second end in sequence in the first direction, wherein in each of the pixel units of the second display panel, the first light emitting element has a third end and a fourth end in sequence in the second direction, wherein the first end and the fourth end are electrically connected to the first pads respectively, and the second end and the third end are electrically connected to the second pads respectively.

4. The tiled display device of claim 1, wherein in each of the pixel units of the first display panel, the first light emitting element has a first end and a second end in sequence in the first direction, wherein in each of the pixel units of the second display panel, the first light emitting element has a third end and a fourth end in sequence in the second direction, wherein the first end and the fourth end are electrically connected to the second pads respectively, and the second end and the third end are electrically connected to the first pads respectively.

5. The tiled display device of claim 1, wherein X is equal to 9, Y is equal to 3, a number of the first pads is 3, and a number of the second pads is 6, wherein in each of the pixel units of the first display panel and in each of the pixel units of the second display panel, an arrangement order of the first pads and the second pads in the first direction is the second pad, the first pad, the second pad, the second pad, the first pad, the second pad, the second pad, the first pad, and the second pad, wherein each of the first pads receives an operating voltage, and each of the second pads receives a reference voltage.

6. The tiled display device of claim 1, wherein X is equal to 9, Y is equal to 3, a number of the first pads is 4, and a number of the second pads is 5, wherein in each of the pixel units of the first display panel, an arrangement order of the first pads and the second pads in the first direction is the first pad, the second pad, the first pad, the second pad, the first pad, the second pad, the second pad, the first pad, and the second pad, wherein in each of the pixel units of the second display panel, an arrangement order of the first pads and the second pads in the first direction is the second pad, the first pad, the second pad, the second pad, the first pad, the second pad, the first pad, the second pad, and the first pad, wherein each of the first pads receives an operating voltage, and each of the second pads receives a reference voltage.

7. The tiled display device of claim 1, wherein X is equal to 9, Y is equal to 3, a number of the first pads is 4, and a number of the second pads is 5, wherein in each of the pixel units of the first display panel, an arrangement order of the first pads and the second pads in the first direction is the first pad, the second pad, the first pad, the second pad, the first pad, the second pad, the second pad, the first pad, and the second pad, wherein in each of the pixel units of the second display panel, an arrangement order of the first pads and the second pads in the first direction is the second pad, the first pad, the second pad, the second pad, the first pad, the second pad, the first pad, the second pad, and the first pad, wherein each of the first pads receives a reference voltage, and each of the second pads receives an operating voltage.

8. The tiled display device of claim 1, wherein X is equal to 8, Y is equal to 3, a number of the first pads is 3, and a number of the second pads is 5, wherein in each of the pixel units of the first display panel, an arrangement order of the first pads and the second pads in the first direction is the second pad, the first pad, the second pad, the first pad, the second pad, the second pad, the first pad, and the second pad, wherein in each of the pixel units of the second display panel, an arrangement order of the first pads and the second pads in the first direction is the second pad, the first pad, the second pad, the second pad, the first pad, the second pad, the first pad, and the second pad.

9. The tiled display device of claim 1, wherein X is equal to 8, Y is equal to 3, a number of the first pads is 3, and a number of the second pads is 5, wherein in each of the pixel units of the first display panel, an arrangement order of the first pads and the second pads in the first direction is the second pad, the first pad, the second pad, the second pad, the first pad, the second pad, the first pad, and the second pad, wherein in each of the pixel units of the second display panel, an arrangement order of the first pads and the second pads in the first direction is the second pad, the first pad, the second pad, the first pad, the second pad, the second pad, the first pad, and the second pad.

10. The tiled display device of claim 1, wherein X is equal to 8, Y is equal to 3, a number of the first pads is 4, and a number of the second pads is 4, wherein in each of the pixel units of the first display panel, an arrangement order of the first pads and the second pads in the first direction is the first pad, the second pad, the first pad, the second pad, the first pad, the second pad, the first pad, and the second pad, wherein in each of the pixel units of the second display panel, an arrangement order of the first pads and the second pads in the first direction is the second pad, the first pad, the second pad, the first pad, the second pad, the first pad, the second pad, and the first pad.

11. The tiled display device of claim 1, wherein X is equal to 7, Y is equal to 3, a number of the first pads is 3, and a number of the second pads is 4, wherein in each of the pixel units of the first display panel and in each of the pixel units of the second display panel, an arrangement order of the first pads and the second pads in the first direction is the second pad, the first pad, the second pad, the first pad, the second pad, the first pad, and the second pad, wherein each of the first pads receives an operating voltage, and each of the second pads receives a reference voltage.

12. The tiled display device of claim 11, wherein in each of the pixel units of the first display panel, the first light emitting element and the second light emitting element are electrically connected to the same one of the second pads.

13. The tiled display device of claim 1, wherein X is equal to 7, Y is equal to 3, a number of the first pads is 4, and a number of the second pads is 3, wherein in each of the pixel units of the first display panel and in each of the pixel units of the second display panel, an arrangement order of the first pads and the second pads in the first direction is the first pad, the second pad, the first pad, the second pad, the first pad, the second pad, and the first pad, wherein each of the first pads receives a reference voltage, and each of the second pads receives an operating voltage.

14. The tiled display device of claim 13, wherein in each of the pixel units of the first display panel, the first light emitting element and the second light emitting element are electrically connected to the same one of the first pads.

15. A tiled display device, comprising:
- a plurality of display panels, wherein each of the display panels comprises:
  - a plurality of pixel units, arranged in an array, wherein each of the pixel units comprises:
    - X pads, wherein X is a positive integer, and the X pads comprise a plurality of first pads and a plurality of second pads; and
    - Y light emitting elements, wherein X is a positive integer, and $$\frac{X}{2} > Y,$$

wherein each of the Y light emitting elements is electrically connected to one of the first pads and one of the second pads, and the Y light emitting elements comprise a first light emitting element, a second light emitting element and a third light emitting element, wherein a color light emitted by the first light emitting element, a color light emitted by the second light emitting element and a color light emitted by the third light emitting element are different from each other, wherein the display panels comprise a first display panel and a second display panel, and a tiling line exists between the first display panel and the second display panel, wherein in each of the pixel units of the first display panel, the first light emitting element has a first end and a second end in sequence in a first direction, wherein in each of the pixel units of the second display panel, the first light emitting element has a third end and a fourth end in sequence in a second direction that is 180 degrees from the first direction, wherein the first end and the fourth end are electrically connected to one of the first pad and the second pad apiece, and the second end and the third end are electrically connected to the other of the first pad and the second pad apiece.

16. The tiled display device of claim 15, wherein in each of the pixel units of the first display panel, the first pads and the second pads have a first arrangement order in the first direction, wherein in each of the pixel units of the second display panel, the first pads and the second pads have a second arrangement order in the second direction, wherein the first direction and the second direction are parallel to the tiling line, and the first arrangement order is the same as the second arrangement order.

17. The tiled display device of claim 15, wherein the color light emitted by the first light emitting element is a red light, the color light emitted by the second light emitting element is a green light, and the color light emitted by the third light emitting element is a blue light, wherein in each of the pixel units of the first display panel, the first light emitting element, the second light emitting element and the third light emitting element are sequentially arranged in the first direction, wherein in each of the pixel units of the second display panel, the first light emitting element, the second light emitting element and the third light emitting element are sequentially arranged in the second direction.

* * * * *